(12) United States Patent
Kaviani et al.

(10) Patent No.: US 7,190,756 B1
(45) Date of Patent: Mar. 13, 2007

(54) HYBRID COUNTER WITH AN ASYNCHRONOUS FRONT END

(75) Inventors: Alireza S. Kaviani, San Jose, CA (US); Carlos M. Vasquez, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 47 days.

(21) Appl. No.: 10/954,889

(22) Filed: Sep. 29, 2004

(51) Int. Cl.
H03K 21/00 (2006.01)
H03K 23/00 (2006.01)

(52) U.S. Cl. .................................... 377/44; 377/118

(58) Field of Classification Search .................... None
See application file for complete search history.

(56) References Cited

U.S. PATENT DOCUMENTS

| | | | | |
|---|---|---|---|---|
| 3,849,635 A | * | 11/1974 | Freedman | 377/44 |
| 4,250,401 A | * | 2/1981 | Sumida | 377/55 |
| 4,570,084 A | * | 2/1986 | Griffin et al. | 326/98 |
| 4,742,471 A | * | 5/1988 | Yoffa et al. | 716/12 |
| 5,020,082 A | * | 5/1991 | Takeda | 377/44 |
| 5,148,387 A | * | 9/1992 | Yano et al. | 708/702 |
| 5,373,542 A | * | 12/1994 | Sunouchi | 377/44 |
| 5,389,836 A | * | 2/1995 | Bertolet et al. | 326/110 |
| 5,614,869 A | * | 3/1997 | Bland | 331/1 A |
| 6,031,425 A | * | 2/2000 | Hasegawa | 331/1 A |
| 6,437,604 B1 | * | 8/2002 | Forbes | 326/98 |
| 7,003,067 B1 | * | 2/2006 | Younis | 377/46 |

OTHER PUBLICATIONS

U.S. Appl. No. 11/015,674, filed Dec. 17, 2004, Kaviani.
U.S. Appl. No. 10/837,186, filed Apr. 30, 2004, Morrison et al.
U.S. Appl. No. 11/015,322, filed Dec. 17, 2004, Kaviani.
Xilinx, Inc.; "Virtex-II Platform FPGA Handbook"; published Dec. 2000; available from Xilinx, Inc., 2100 Logic Drive, San Jose, California 95124; pp. 161-183.

* cited by examiner

Primary Examiner—Tuan T. Lam
(74) Attorney, Agent, or Firm—W. Eric Webostad; Justin Liu

(57) ABSTRACT

Integrated circuit counting apparatuses are described. More particularly, a hybrid counter (203) including an asynchronous counter (310) front end and a synchronous counter (311) back end is described. The asynchronous counter (310) including at least one asynchronous counter stage (341, 342, 343) having an asynchronous level-mode state machine (381, 382). The asynchronous level-mode state machine formed of Differential Cascode Voltage Switch Logic.

20 Claims, 9 Drawing Sheets

HYBRID COUNTER WITH AN ASYNCHRONOUS FRONT END

FIELD OF THE INVENTION

One or more aspects of the invention relate generally to a hybrid counter and more particularly, to a hybrid counter with an asynchronous front end and a synchronous back end.

BACKGROUND OF THE INVENTION

Generally, two types of conventional counters exist, namely, synchronous counters and asynchronous counters. Synchronous counters conventionally are used in a variety of applications, where the frequency of the reference clock is at least as fast as the frequency of the input signal being processed.

Synchronous counters are favored for high-speed applications due to latency and robustness of synchronous sequential circuits. However, synchronous counters tend to be a source of noise at the frequency of the input clock signal. Operation of conventional flip-flops at high frequencies can be a significant contributing factor to such noise. Moreover, capacitive load at the clock input rises quickly with the size of the counter limiting its maximum frequency.

Asynchronous counters on the other hand tend to generate less noise than comparable synchronous counters. Unfortunately, asynchronous counters tend to have large latency in comparison to comparable synchronous counters. Asynchronous counters conventionally divide down frequency of an input signal. Such an input signal is divided down in successive stages, where the output of an immediately preceding stage is the reference clock of the next stage. Thus, propagation delay increases as the number of stages of an asynchronous counter increases.

Accordingly, it would be desirable and useful to provide a high-speed counter with low latency.

SUMMARY OF THE INVENTION

An aspect of the invention is an asynchronous counter, including: an asynchronous counter stage coupled to receive an input clock signal and a complement of the input clock signal. The asynchronous counter includes an asynchronous level-mode state machine configured to provide count signals responsive to the input clock signal and the complement of the input clock signal, where the asynchronous level-mode state machine is formed of Differential Cascode Voltage Switch Logic.

Another aspect of the invention is a hybrid counter including: a first stage coupled for receiving a input clock signal, and a second stage coupled for receiving an output clock signal from the first stage. The first stage includes an asynchronous counter having at least one asynchronous counter stage with an asynchronous level-mode state machine. In some embodiments the asynchronous level-mode state machine is formed of Differential Cascode Voltage Switch Logic. The second stage includes a synchronous counter.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
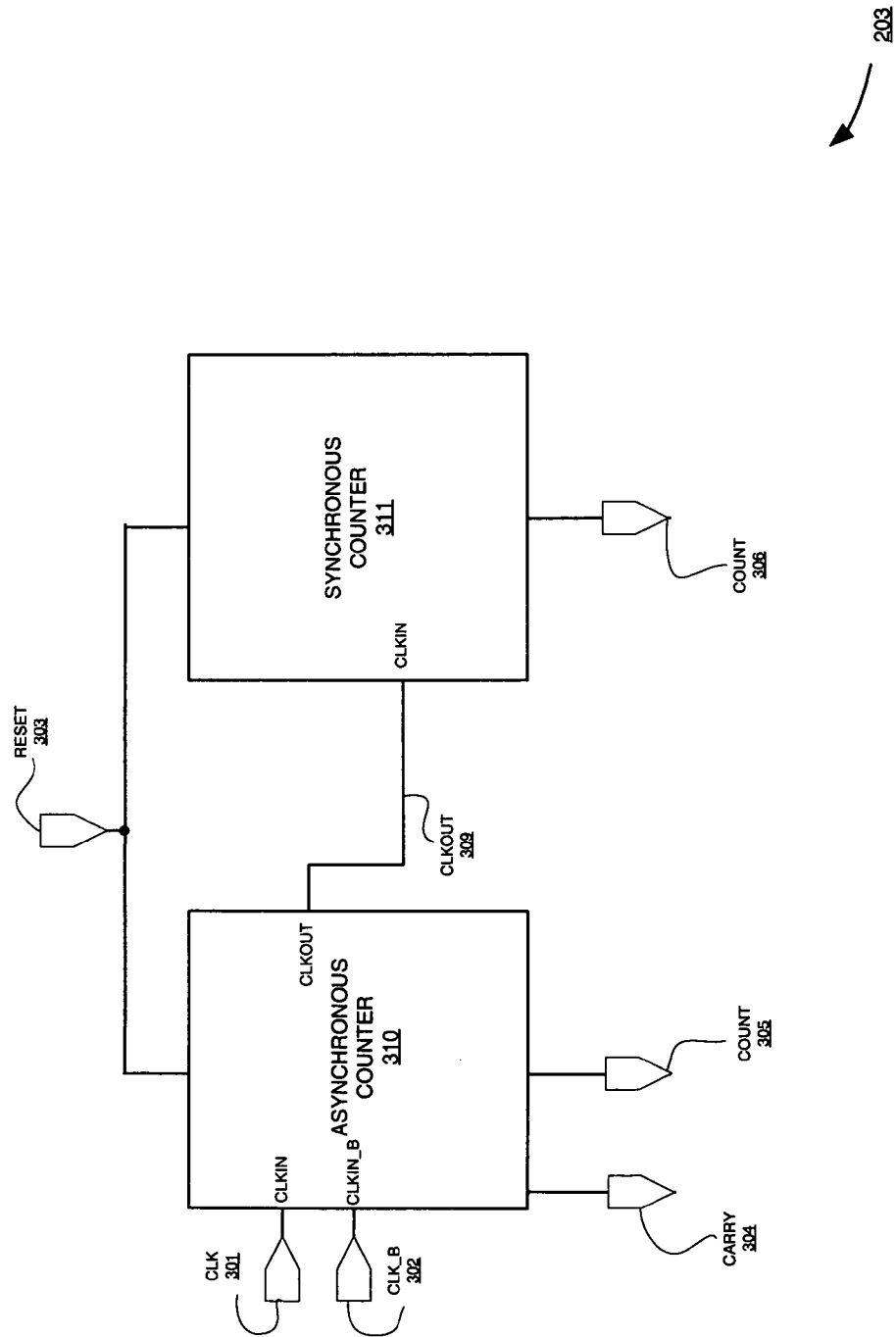
FIG. 1 is a block/schematic diagram depicting an exemplary embodiment of a hybrid counter.

FIG. 1 is a block/schematic diagram depicting an exemplary embodiment of a hybrid counter 203. Hybrid counter 203 includes an asynchronous counter 310 and synchronous counter 311. It should be appreciated that asynchronous counter 310 is at a front end of hybrid counter 203 for receiving a high-speed input signal, such as clock signal ("CLK") 301, and that synchronous counter 311 is downstream from asynchronous counter 310. Though one synchronous counter 311 is described, more than one synchronous counter may be coupled in series with asynchronous counter 310. Notably, by modularly increasing the number of synchronous counters, count width may be incrementally increased.

Asynchronous counter 310 is coupled to receive clock signal 301 and a complement of clock signal 301, namely, clock signal ("CLK_B") 302. Asynchronous counter 310 is configured to provide an output clock signal, such as clock signal ("CLKOUT") 309, responsive to input clocking.

In an embodiment of asynchronous counter 310, Differential Cascode Voltage Switch Logic ("DCVSL") is used. Both of clock signals 301 and 302 may be used for input clocking in such a DCVSL embodiment of asynchronous counter 310. As described in additional detail below, clocking may be done on an edge, such as a rising edge, of both of clock signals 301 and 302.

DCVSL provides some advantages over Single-Ended Complementary Metal-Oxide Semiconductor ("CMOS") such as level shifting and symmetry (e.g., one-type of transistor therefore less process variation). Additionally, as described herein, an embodiment of asynchronous counter 310 has less latency and consumes less area than a similarly positioned conventional asynchronous counter.

In high-speed applications, response time of hybrid counter 203 may be significant. Accordingly, a DCVSL embodiment of asynchronous counter 310 may exhibit significantly less latency than a conventional embodiment of asynchronous counter 310. Of course, latency will depend in part on the length of a count and transistor sizing, among other factors, and thus will vary with implementation. However, by way of example and not limitation, it should be understood that for an input frequency of at least approximately 400 MHz may be used. More particularly for an input frequency of approximately 800 MHz, an implementation of hybrid counter 203 may have a latency no greater than approximately 700 ps for a count from zero to fifteen, where latency for each stage of asynchronous counter 310 is approximately 60 ps. Furthermore, for such an implementation with an input frequency of approximately 800 MHz, an output clock signal, such as clock signal 309, may be approximately 100 MHz.

Asynchronous counter 310 is configured to provide an output count signal ("COUNT") 305 responsive to input clocking. Bit width of count signal 305 is at least one bit wide, where such bit width is dependent upon count length. Optionally, asynchronous counter 310 may be configured to provide other signals, including, but not limited to, a carry output signal ("CARRY") 304.

Clock signal 309 is provided to a respective clock signal input of synchronous counter 311. Notably, the number of stages in asynchronous counter may be increased to further reduce frequency of clock signal 309. Because frequency of clock signal 309 may be reduced for operation of synchronous counter 311, hybrid counter 203 may overall consume less power even though asynchronous counter 310 consumes more power for additional stages. In other words, an increase in power consumption by asynchronous counter 310 may lead to an overall decrease in power consumption by hybrid counter 203 due to a reduction in power consumption by synchronous counter 311 operating at a reduced frequency. However, an increase in the number of stages of asynchronous counter 310 further increases the latency of hybrid counter 203.

To cascade synchronous counters to increase count length, cascade input ("CASIN") and cascade output ("CASOUT") ports of synchronous counter 311 may be used. Moreover, a first synchronous counter in a chain of synchronous counters, such as synchronous counter 311, may have its cascade input tied to ground to maintain it in a counting state subject to a reset.

Asynchronous counter 310 and synchronous counter 311 have their respective reset ports coupled to receive a same reset signal 303. To reset asynchronous counter 310, reset signal 303 may be asserted and a logic one may be put on clock signal 301. This is done to reduce delay.

Because DCVSL is used to provide asynchronous counter 310, asynchronous counter 310 may be coupled to a different supply voltage than an oscillator used to supply clock signal 301. Clock signal 301 may be provided using a substantially clean supply voltage, such as Vdd, and asynchronous counter 310 may be coupled to a supply voltage 340 that is not substantially clean. Thus, this reduces the possibility of noise from asynchronous counter 310 negatively affecting operation of the oscillator. However, for purposes of clarity, it is assumed that supply voltage 340 is Vdd.

A cascade output signal from a first synchronous counter in the chain, such as synchronous counter 311, may be provided to a cascade input port of a next synchronous counter in the chain. Notably, count width of synchronous counter 311 may be any of a variety of widths as is known.

Figure 2:
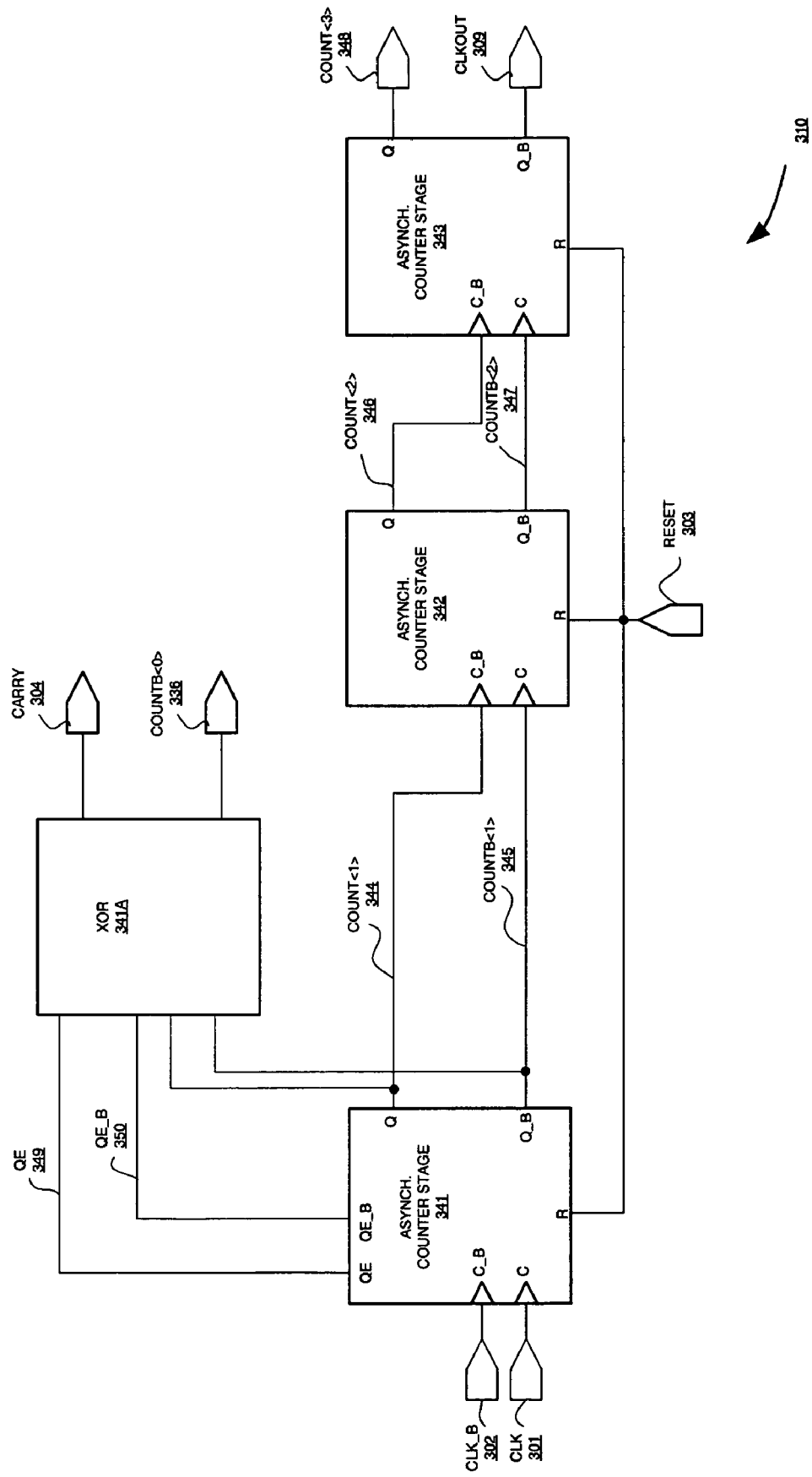
FIG. 2 is a lower-level schematic/block diagram depicting an exemplary embodiment of an asynchronous counter.

FIG. 2 is a lower-level schematic/block diagram depicting an exemplary embodiment of asynchronous counter 310. Asynchronous counter 310 includes three asynchronous counter stages ("counter stages"), namely, counter stages 341, 342, and 343. Though three counter stages are shown, any number of counter stages greater than or equal to two may be used, subject to design response time constraints. Clock signal 301 and its complement, clock signal 302, are provided as inputs to clock and clock complement ports of asynchronous counter stage 341. Asynchronous counter stage 341 is configured to provide an output signal indicative of a count, such as count<1> signal 344, and its complement, such as countb<1> signal 345 (collectively "count signals") responsive to clock signals 301 and 302. Additionally, asynchronous counter stage 341 may optionally be configured to provide edge output signals, such as QE signal 349 and its complement QE_B signal 350, responsive only to either a rising or falling edge of input clocking to asynchronous counter stage 341.

Notably, as a first stage, asynchronous counter stage 341 is configured to provide a count one ("count<1>") making the counter an edge counter. However, a count zero ("count<0>") is provided from DCVSL XOR gate 341A using in part count one. Thus, a count one is first obtained before a count zero may be obtained. Count zero logic 341A may be implemented with a DCVSL XOR gate, which because both positive and negative logic outputs are provided with DCVSL includes an XNOR output.

Data inputs to DCVSL XOR gate 341A are QE signal 349, QE_B signal 350, count<1> signal 344, and countb<1> signal 345. Outputs, which may be inverted, from DCVSL XOR gate 341A are carry signal 304 and countb<0> 336.

Asynchronous counter stage 342 is coupled to receive output from asynchronous counter stage 341. For input clocking to asynchronous counter stage 342, count<1> signal 344 and countb<1> signal 345 are respectively provided to a complement clock input port ("C_B") and a clock input port ("C") of asynchronous counter stage 342. Responsive to count signals 344 and 345, asynchronous counter stage 342 is configured to provide count<2> signal 346 and its complement countb<2> signal 347.

Asynchronous counter stage 343 is coupled to receive output from asynchronous counter stage 342. For input clocking to asynchronous counter stage 343, count<2> signal 346 and countb<2> signal 347 are respectively provided to a complement clock input port ("C_B") and a clock input port ("C") of asynchronous counter stage 343 (thereby effectively inverting the signals). Responsive to count signals 346 and 347, asynchronous counter stage 343 is configured to provide count<3> signal 348 and its complement countb<3> signal, which is used as an output clock signal, namely, clock output signal 309.

Accordingly, it should be appreciated that asynchronous counter stages progressively step down frequency, such that frequency of clock output signal 309 is a fraction of the frequency of clock input signal 301. Continuing the above example, count<3> transitions responsive to every fourth edge of input clock signal 301.

Figure 3:
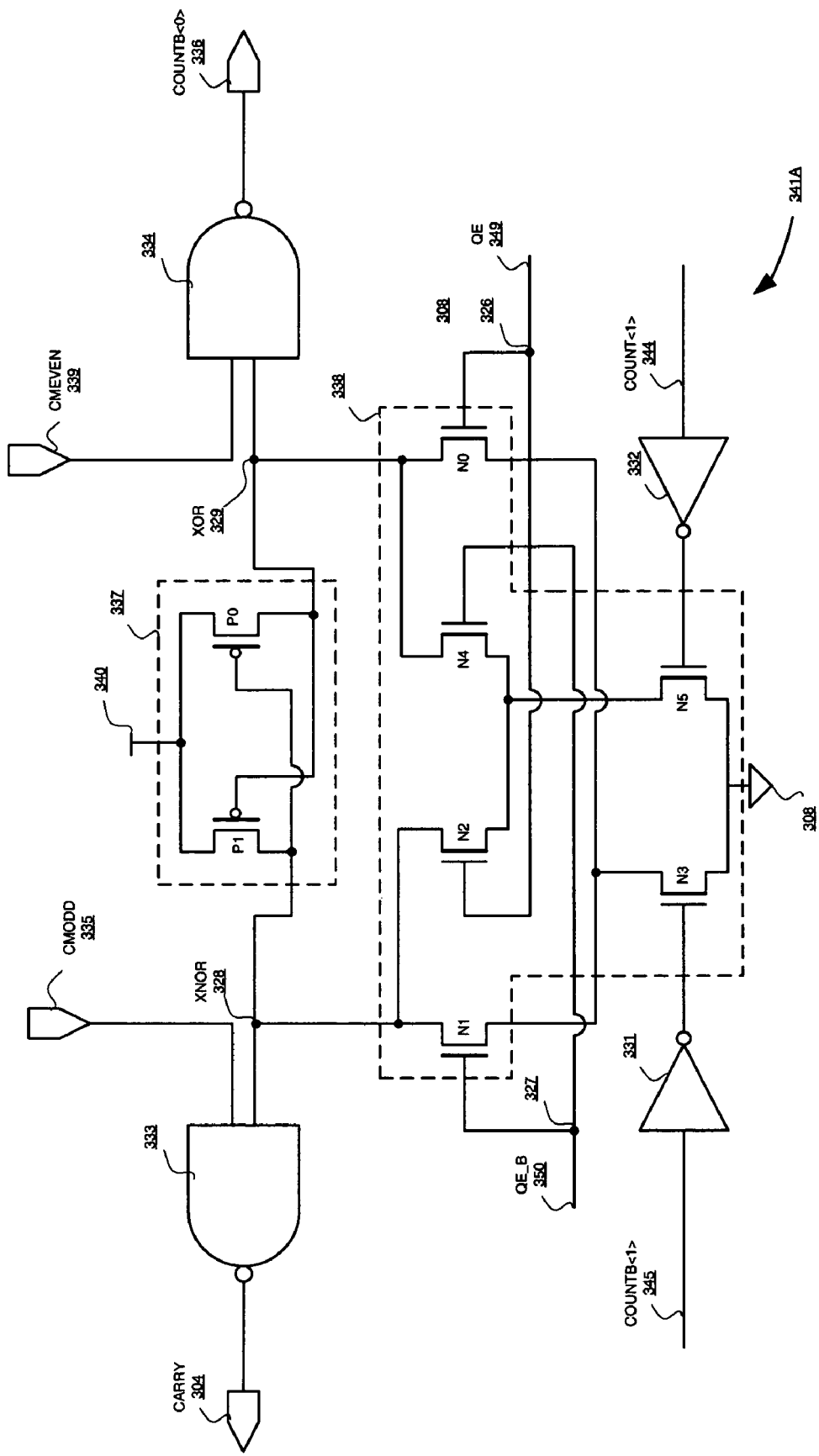
FIG. 3 is a schematic diagram depicting an exemplary embodiment of an asynchronous counter stage for count zero.

FIG. 3 is a schematic diagram depicting an exemplary embodiment of DCVSL XOR gate 341A. DCVSL XOR gate 341A provides countb<0> signal 336 responsive to count<1> signal 344, countb<1> signal 345, QE signal 349 and QE_B signal 350 from asynchronous counter stage 341. These four signals are data inputs to DCVSL XOR gate 341A to provide countb<0> signal 336 and carry signal 304. DCVSL XOR gate 341A includes a DCVSL logic section 338 configured with transistors N0, N1, N2, N3, N4, and N5. These transistors are all n-type MOS ("NMOS"). Notably, a first or head stage, namely, asynchronous counter stage 341 shown in FIG. 2, is configured as an edge counter. Thus, either each rising or falling edge is counted. Notably, by using both clock signal 301 and its complement signal 302 shown in FIG. 2, edges, such as rising edges, of both signals are used for counting. This means that in effect both edges, rising and falling, of clock signal 301 are used for counting. Moreover, edge counting is provided without an increase in size of an asynchronous counter stage. Optionally, counter maximum odd signal 335 and counter maximum even signal 339 may be respectively input to NAND gates 333 and 334 to be respectively NANDed with XNOR output 328 and XOR output 329 to provide carry signal 304 and countb<0> signal 336, respectively.

Figure 4:
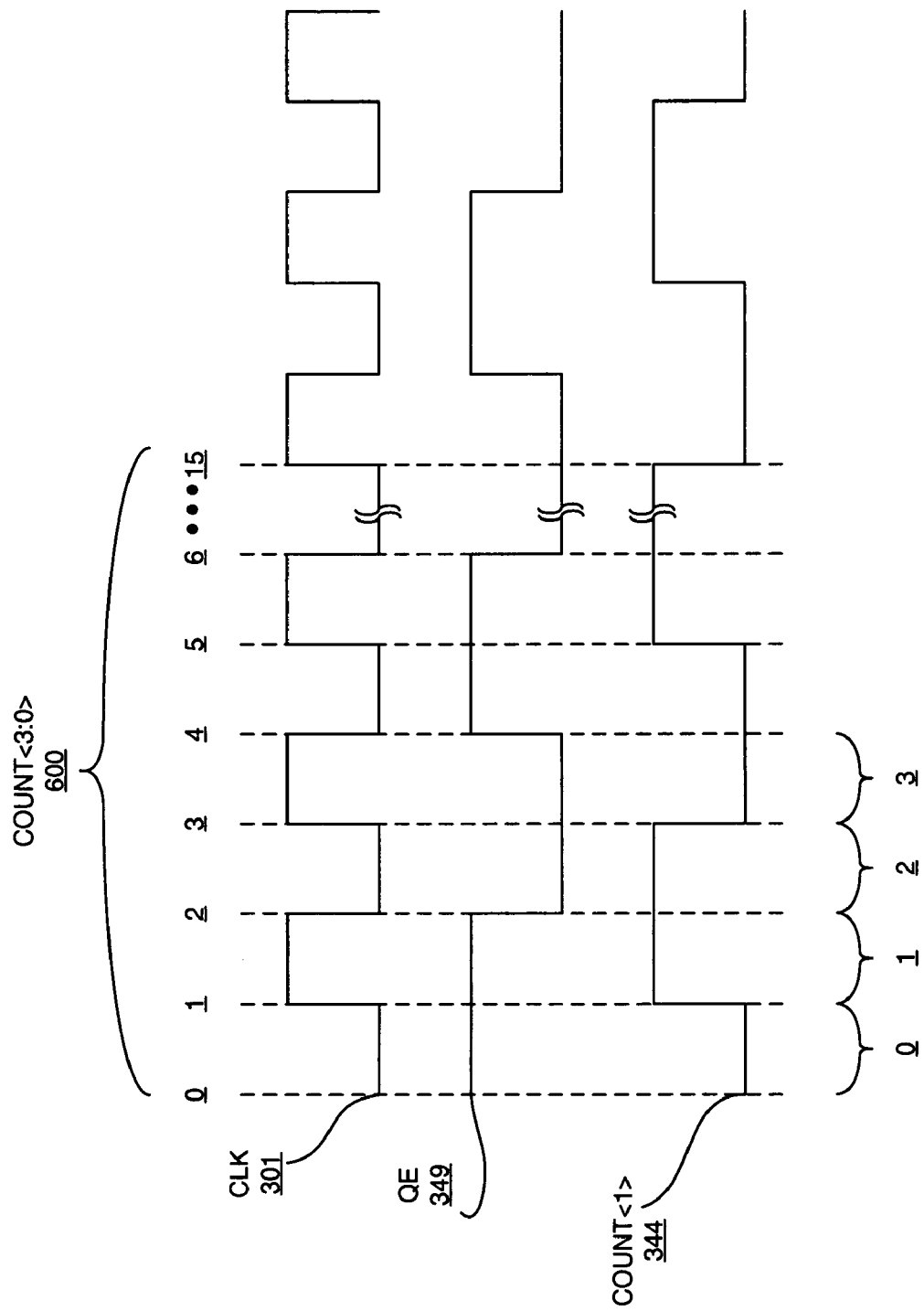
FIG. 4 is a signal diagram depicting an exemplary embodiment of input and outputs of an asynchronous counter stage for count one.

FIG. 4 is a signal diagram depicting an exemplary embodiment of input and outputs of asynchronous counter stage 341. A first asynchronous counter stage, such as asynchronous counter stage 341, uses clock signal 301 and its complement signal 302 for generating inputs to DCVSL XOR gate 341A and asynchronous counter stage 342. Notably, though complements of signals are used herein, for clarity only non-inverted signals are described to avoid repetition.

Each pulse of clock signal 301 is an increment to an overall count 600, which for this example is four bits, namely, count <3:0>, though any amount greater than one may be used. Moreover, though a count range from 0 to 15 is illustratively shown, other ranges may be used. QE signal 349 is provided responsive to falling edges of clock signal 301, such as with a falling edge triggered flip-flop as described below in additional detail. Count signal 344 is provided responsive to rising edges of clock signal 301, such as with a rising edge triggered flip-flop.

With continuing reference to FIG. 4 and renewed reference to FIG. 3, operation of asynchronous counter stage 341 is further described.

Count signal 344 and its complement signal 345 are respectively provided to a count input port and a complement count input port of asynchronous counter stage 341. These input ports may optionally be buffered with inverters 332 and 331. Inverters 331 and 332 may be formed using NMOS, CMOS or other logic.

Output of inverter 332 from count signal 344 is provided to a gate of transistor N5, and output of inverter 331 from count signal 345 is provided to a gate of transistor N3. Source terminals ("sources") of transistors N3 and N5 are coupled to ground.

Outputs of logic section 338 are provided from drain terminals ("drains") of transistors N1 and N0, unless a comparator is to be used in combination with asynchronous counter 310 of FIG. 1.

Optionally, for example, if a comparator is coupled to hybrid counter 203 of FIG. 1, an input of NAND gate 333 is coupled to the drain of transistor N1, and an input of NAND gate 334 is coupled to the drain of transistor N0. Drains of transistors N1 and N0 may be respectively connected to output nodes 328 and 329. Another input of NAND gate 333 is coupled for receiving a counter maximum odd signal 335. Another input of NAND gate 334 is coupled for counter maximum even signal 339. Signals 335 and 339 are for use with a comparator. However, NAND gates 333 and 334 may be omitted, along with signals 335 and 339, if no comparator is used; in an embodiment without NAND gates 333 and 334, NAND gates 333 and 334 may be replaced with respective inverters. NAND gates 333 and 334 are for asynchronous counter stage 341 only. Interim stages, such as asynchronous counter stage 342, omit NAND gates 333 and 334. Output of NAND gate 333 is carry signal 304. Output of NAND gate 334 is countb<0> signal 336. NAND gates 333 and 334 may be formed of transistors of the same type as those of logic section 338, or may be formed using CMOS.

Supply voltage 340 may be coupled to a cross-coupled load 337, such as provided by cross-coupled PMOS transistors P1 and P0. The drain of transistor P0 is connected to output node 329, and the drain of transistor P1 is connected to output node 328. The gate of transistor P0 is connected to output node 328, and the gate of transistor P1 is connected to output node 329. The sources of transistors P0 and P1 are coupled to supply voltage 340.

Accordingly, when voltage at output node 328 is at a logic low level, transistor P0 is put in an on state (i.e., substantially source-drain conductive). In response, voltage at output node 329 is pulled up toward supply voltage 340 thereby causing transistor P1 to be in an off state (i.e., substantially source-drain non-conductive). Transistor P1 does not have any significant impact on voltage at output node 328 when transistor P1 is in an off state. The above description is merely reversed when voltage at output node 329 is at a logic low level. Thus, cross-coupled load 337 provides respective voltage pull-up at output nodes 328 and 329.

For clarity, a cross-coupled load, such as described above, is referred hereinafter as such with load and complemented load ports.

Returning to logic section 338, output edge signal 349 is provided to input node 326. Node 326 is connected to a gate of transistor N0 and a gate of transistor N2. Sources of transistors N2 and N4 are commonly coupled to a drain of transistor N5. A drain of transistor N2 is coupled to output node 328, and a drain of transistor N4 is coupled to output node 329.

Complemented output edge signal 350 is provided to input node 327. Node 327 is connected to gates of transistors N1 and N4. Sources of transistors N1 and N0 are commonly coupled to a drain of transistor N3. A drain of transistor N1 is coupled to output node 328, and a drain of transistor N0 is coupled to output node 329.

Notably, for count<0> signal sourced from output node 329, logic section 338 is an exclusive-OR ("XOR") logic function, meaning in part that output node 329 is a "positive logic output node." For a carry bit signal at output node 328, logic gate is an exclusive-NOR ("XNOR") logic function, meaning in part that output node 328 is a "negative logic output node."

For output edge signal 349 at a high logic level and count signal 344 at a low logic level, count<0> signal at node 329 is pulled to supply voltage 340, namely, a high logic level, and XNOR output at node 328 is coupled to ground 308, namely, a low logic level.

For output edge signal 349 at a high logic level and count signal 344 at a high logic level, count<0> signal at node 329 is at a low logic level and XNOR output at node 328 is at a high logic level.

For output edge signal 349 at a low logic level and count signal 344 at a high logic level, count<0> at node 329 is at a high logic level and XNOR output at node 328 is at a low logic level.

For output edge signal 349 at a low logic level and count signal 344 at a low logic level, count<0> at node 329 is at a low logic level and XNOR output at node 328 is at a high logic level.

In part, an XOR function has been described for providing count<0>. At this point, it should be appreciated that this portion of asynchronous counter stage 341 produces count<0> with the inclusion of DCVSL XOR gate 341A. DCVSL XOR gate 341A applies to lead asynchronous counter stage 341 and is not included in subsequent asynchronous counter stages, such as asynchronous counter stages 342 and 343.

Figure 5:
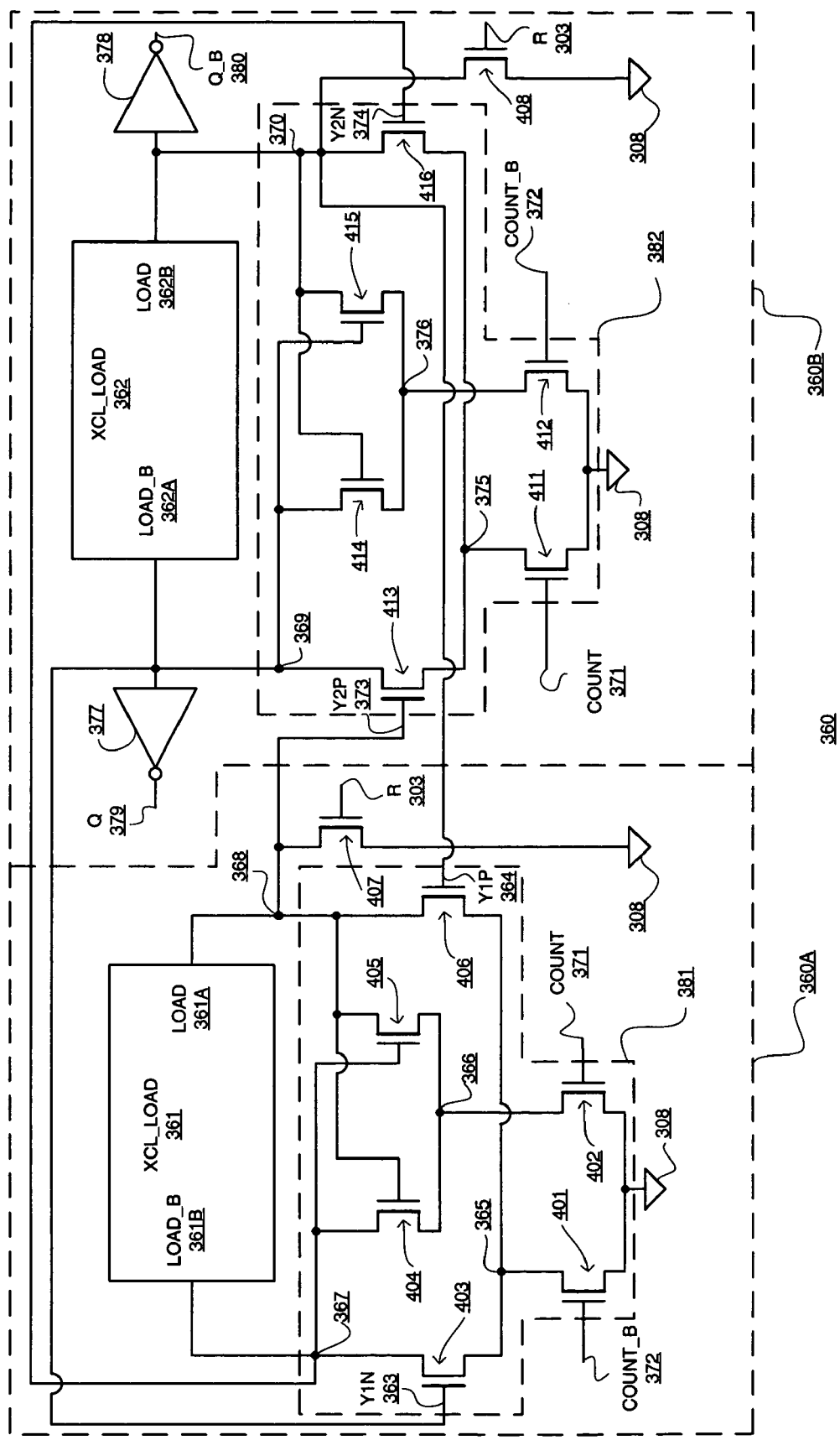
FIG. 5 is a block/schematic diagram depicting an exemplary embodiment of an asynchronous counter stage for a count other than count zero.

FIG. 5 is a block/schematic diagram depicting an exemplary embodiment of an asynchronous counter stage 360. Asynchronous counter stage 360 may be used for asynchronous counter stages 342 and 343, and a portion of asynchronous counter stage 341.

Asynchronous counter stage 360 includes two sections, namely asynchronous counter sub-stages 360A and 360B. Each asynchronous counter sub-stage 360A and 360B implements the same state machine, which in this embodiment is an asynchronous DCVSL state machine ("state machine"). Asynchronous counter sub-stage 360A includes state machine 381, and asynchronous counter sub-stage 360B includes state machine 382.

State machine 381 includes six transistors, namely, NMOS transistors 401 through 406. State machine 382 includes six transistors, namely, NMOS transistors 411 through 416. State machine 381 is connected to cross-coupled load 361 at output nodes 367 and 368, and state machine 382 is connected to cross-coupled load 362 at output nodes 369 and 370. More particularly, state machine 381 is connected to cross-coupled load port 361A at output node 368 and to cross-coupled load complement port 361B at output node 367, and state machine 382 is connected to cross-coupled load port 362B at output node 370 and to cross-coupled load complement port 362A at output node 369.

Output from asynchronous counter 360 is sourced from output nodes 369 and 370. Optionally, output nodes 369 and 370 may be respectively connected to inverters 377 and 378. Output of inverter 377 is output signal ("Q") 379, and output of inverter 378 is output signal ("Q_B") 380. Output signals 379 and 380 are count output signals. For example, for asynchronous counter stage 341, output signals 379 and 380 are count signals 344 and 345, respectively. For example, for asynchronous counter stage 342, output signals 379 and 380 are count signals 346 and 347, respectively. For example, for asynchronous counter stage 343, output signals 379 and 380 are count signals 348 and 309, respectively, where signal 309 is a clock output signal.

Connected to output node 368 of state machine 381 is NMOS reset pass transistor 407. A gate of reset pass transistor 407 is coupled to receive reset signal 303. A source of reset pass transistor 407 is coupled to ground 308, and a drain of reset pass transistor 407 is connected to output node 368. Accordingly, when reset signal 303 is at a high logic level, voltage at output node 368 is pulled toward ground thereby pulling up voltage at output node 367 toward a supply voltage via a portion of cross-coupled load 361.

Connected to output node 370 of state machine 382 is NMOS reset pass transistor 408. A gate of reset pass transistor 408 is coupled to receive reset signal 303. A source of reset pass transistor 408 is coupled to ground 308, and a drain of reset pass transistor 408 is connected to output node 370. Accordingly, when reset signal 303 is at a high logic level, voltage at output node 370 is pulled toward ground thereby pulling up voltage at output node 369 toward a supply voltage via a portion of cross-coupled load 362.

Notably, for resetting asynchronous counter stage 360, count input signal 371 and its complemented signal 372 must respectively be at a high logic level and a low logic level, such as logic 1 and 0.

Each state machine 381 and 382 has four inputs; however, two of these inputs are the same for both state machines. Two of these inputs are count input signals 371 and its complemented signal 372 ("count input signals"). Count input signals 371 and 372 are respectively provided to clock and complemented clock input ports of a respective asynchronous counter stage. For example, for asynchronous counter stage 342, count input signal 371 is complemented count signal 345, as complemented count signal 345 is provided to a clock port of asynchronous counter stage 342, and complemented count input signal 372 is count signal 344, as count signal 344 is provided to a complemented clock port of asynchronous counter stage 342. This example may be repeated for the other two asynchronous counter stages 341 and 343 of FIG. 2.

The other two inputs to each state machine 381 are feedback or state inputs. State inputs to state machine 381 are Y1N 363 and Y1P 364, where "N" and "P" respectively indicate negative and positive. State input Y1N 363 is sourced from output node 369 of state machine 382, and state input Y1P is sourced from output node 370 of state machine 382. State inputs to state machine 382 are Y2N 374 and Y2P 373, where "N" and "P" respectively indicate negative and positive. State input Y2N 374 is sourced from output node 367 of state machine 381, and state input Y2P 373 is sourced from output node 368 of state machine 381. Accordingly, state machines 381 and 382 in combination may be though of as a single asynchronous level mode DCVSL state machine with two state machine portions 381 and 382.

Count input signal 371 is provided to a gate of transistor 402 and to a gate of transistor 411, and complemented count input signal 372 is provided to a gate of transistor 401 and to a gate of transistor 412. Transistors 401 and 402 have their sources commonly coupled to ground 308, and transistors 411 and 412 have their sources commonly coupled to ground 308.

A drain of transistor 401 is coupled to sources of transistors 403 and 406 via node 365. A gate of transistor 403 is coupled to receive state input signal 363, and a gate of transistor 406 is coupled to receive state input signal 364. A drain of transistor 403 is coupled to output node 367, and a drain of transistor 406 is coupled to output node 368.

A drain of transistor 402 is coupled to sources of transistors 404 and 405 via node 366. A gate of transistor 404 and a drain of transistor 405 are commonly coupled to output node 368, and a gate of transistor 405 and a drain of transistor 404 are commonly coupled to output node 367.

Notably, state machine portions 381 and 382 total only twelve transistors. Furthermore, it should be appreciated that state machine portions 381 and 382 are level shifting. In other words, output at output nodes is responsive only to transistor gating signals.

Recall that count signals 344 and 345 are outputs of asynchronous counter stage 341 provided to DCVSL XOR gate 341A and to asynchronous counter stage 342. As described with reference to FIG. 5, count signals 344 and 345 may be respectively sourced from nodes 370 and 369, or from outputs of inverters 377 and 378. In other words, from input clock signals 371 and 372, which may be clock signals 301 and 302, respectively, count signals 344 and 345 may be generated.

Recall from the above reference to FIG. 3 that output edge signals 349 and 350 are outputs of asynchronous counter stage 341 provided to DCVSL XOR gate 341A. Output edge signals 349 and 350 may be respectively obtained from nodes 368 and 367. It should be understood that output edge signals 349 and 350 for asynchronous stage 341 may be obtained from the same circuitry used to form asynchronous stages 342 and 343, or with the addition of just two output buffers.

Due to there being no more than two transistors, namely, one of transistors 411 and 412 and one of transistors 413, 414, 415, and 416, from a source, such as ground 308, to propagate to an output node, namely, one of output nodes 369 and 370, latency is limited to passing a signal through only two transistors when output is sourced from state machine portion 382. Moreover, delay due to providing a signal to pass gate transistors 413 and 416 likewise is limited to sourcing a signal through only two transistors of state machine portion 381. Additionally, only 12 transistors are used to provide a counter stage operation, which consumes less area than a conventional toggle flip-flop.

Figure 6:
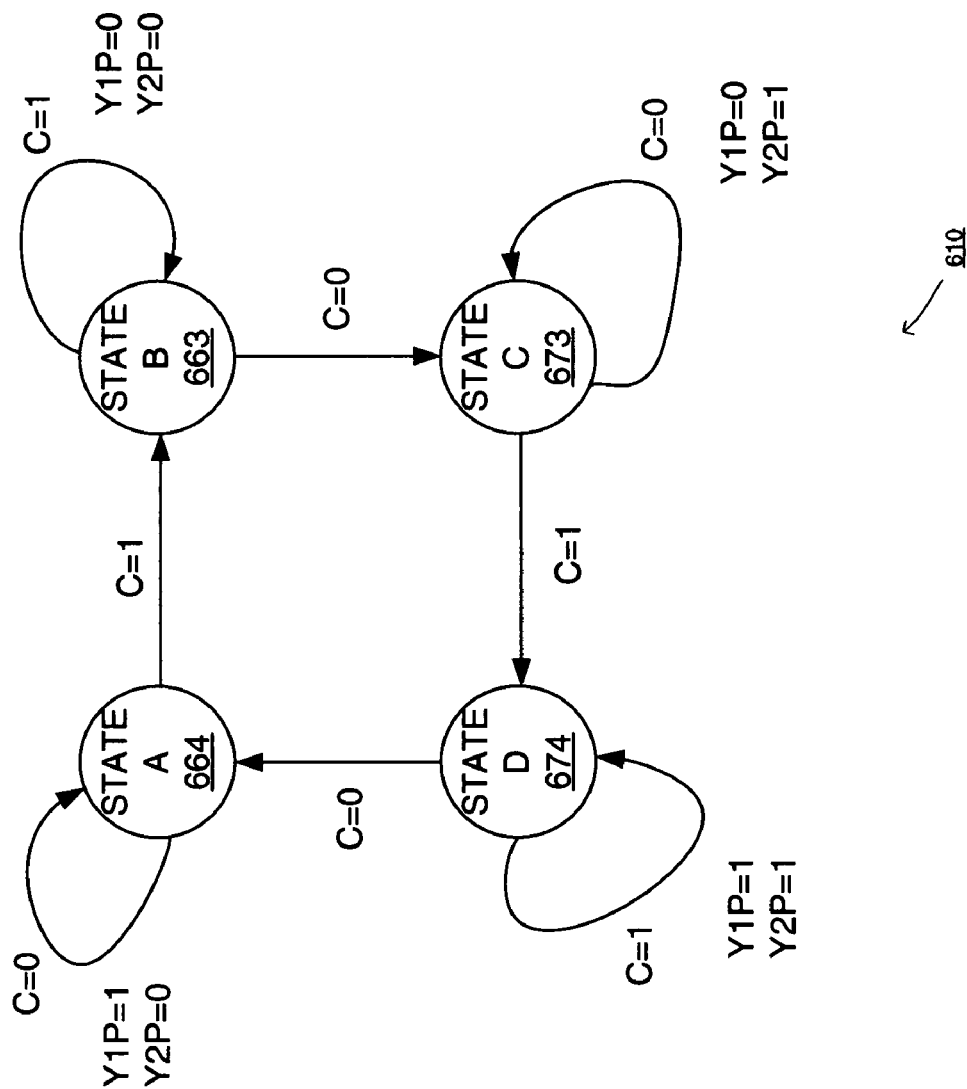
FIG. 6 is a state diagram depicting state for the exemplary embodiment of a state machine of FIG. 5.

FIG. 6 is a state diagram depicting state for the exemplary embodiment of state machine portions 381 and 382 ("state machine") of FIG. 5. State machine 610 is described in terms of positive logic or polarity for clarity, as negative logic or polarity directly follows therefrom. Thus, state assignments for states A, B, C and D are Y1P and Y2P logic levels, where Y1P and Y2P are shown in FIG. 5.

For state machine 610 in state A 664, Y1P equals logic level one and Y2P equals logic level zero. From state A, responsive to a clock signal, such as count input 371, equal to logic level zero, state machine 610 stays in state A 664. Responsive to count input 371 equal to logic level one, state machine 610 transitions from state A 664 to state B 663, where state assignments for state B are Y1P and Y2P both equal to logic level zero. Responsive to count input 371 equal to logic level one, state machine 610 stays in state B 663. Responsive to count input 371 equal to logic level zero, state machine 610 transitions from state B 663 to state C 673, where state assignments for state C are Y1P equal to logic level zero and Y2P equal to logic level one. Responsive to count input 371 equal to logic level zero, state machine 610 stays in state C 673. Responsive to count input 371 equal to logic level one, state machine 610 transitions from state C 673 to state D 674, where state assignments for state D are Y1P and Y2P are both equal to logic level one. Responsive to count input 371 equal to logic level one, state machine 610 stays in state C 673. Responsive to count input 371 equal to logic level zero, state machine 610 transitions from state D 674 to state A 664. Thus, as can be seen, each of state machines 381 and 382 have essentially a toggle flip-flop operation.

Figure 7:
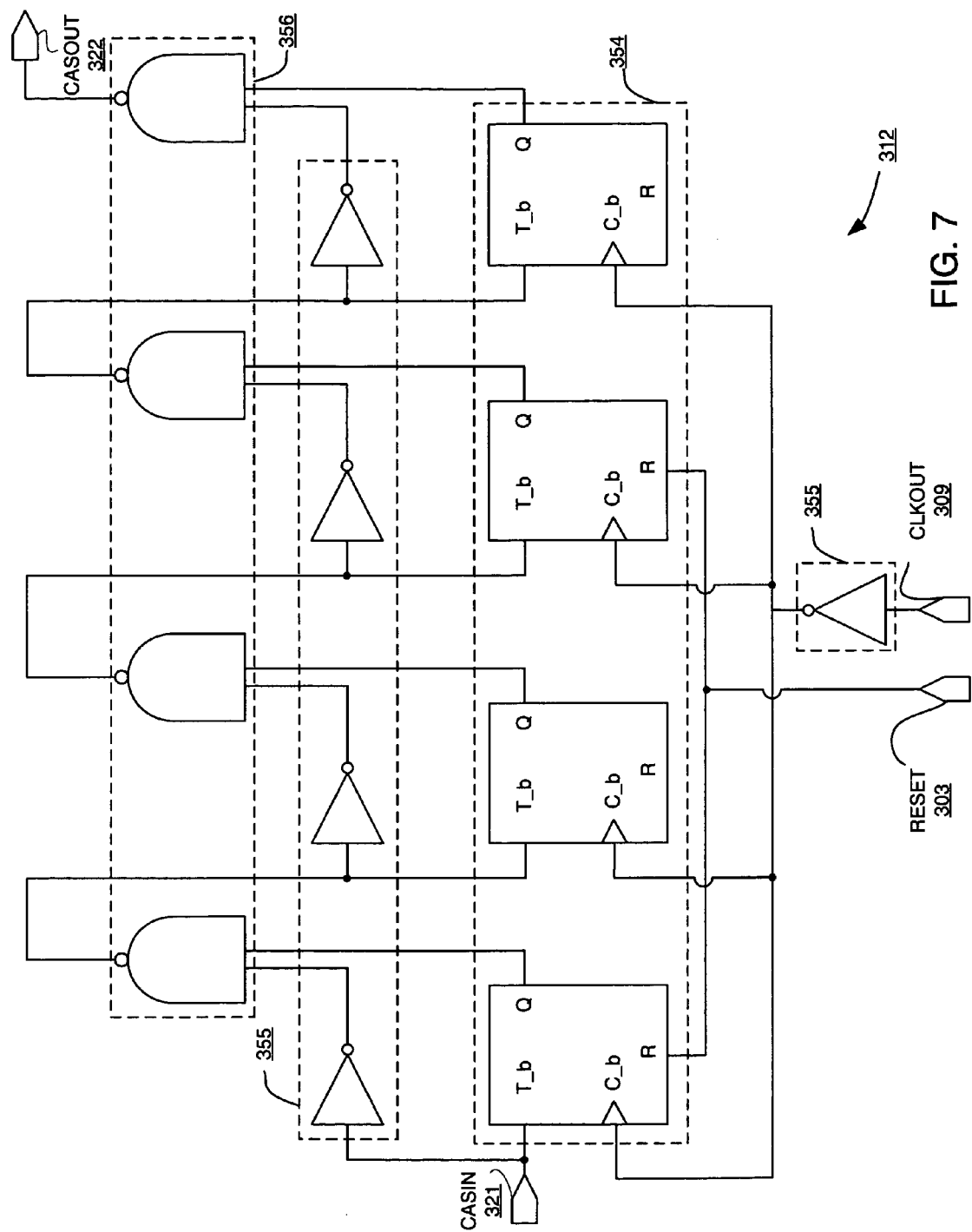
FIG. 7 is a schematic diagram depicting an exemplary embodiment of synchronous counter.

FIG. 7 is a schematic diagram depicting an exemplary embodiment of synchronous counter 312. Synchronous counter 312 includes toggle flip-flops 354, inverters 355, and NAND gates 356. Except for layout of an integrated circuit including synchronous counter 312, synchronous counter 312 is conventional and thus is not described in unnecessary detail. In some embodiments, synchronous counter 312 may be used as synchronous counter 311 in hybrid counter 203.

Figure 8:
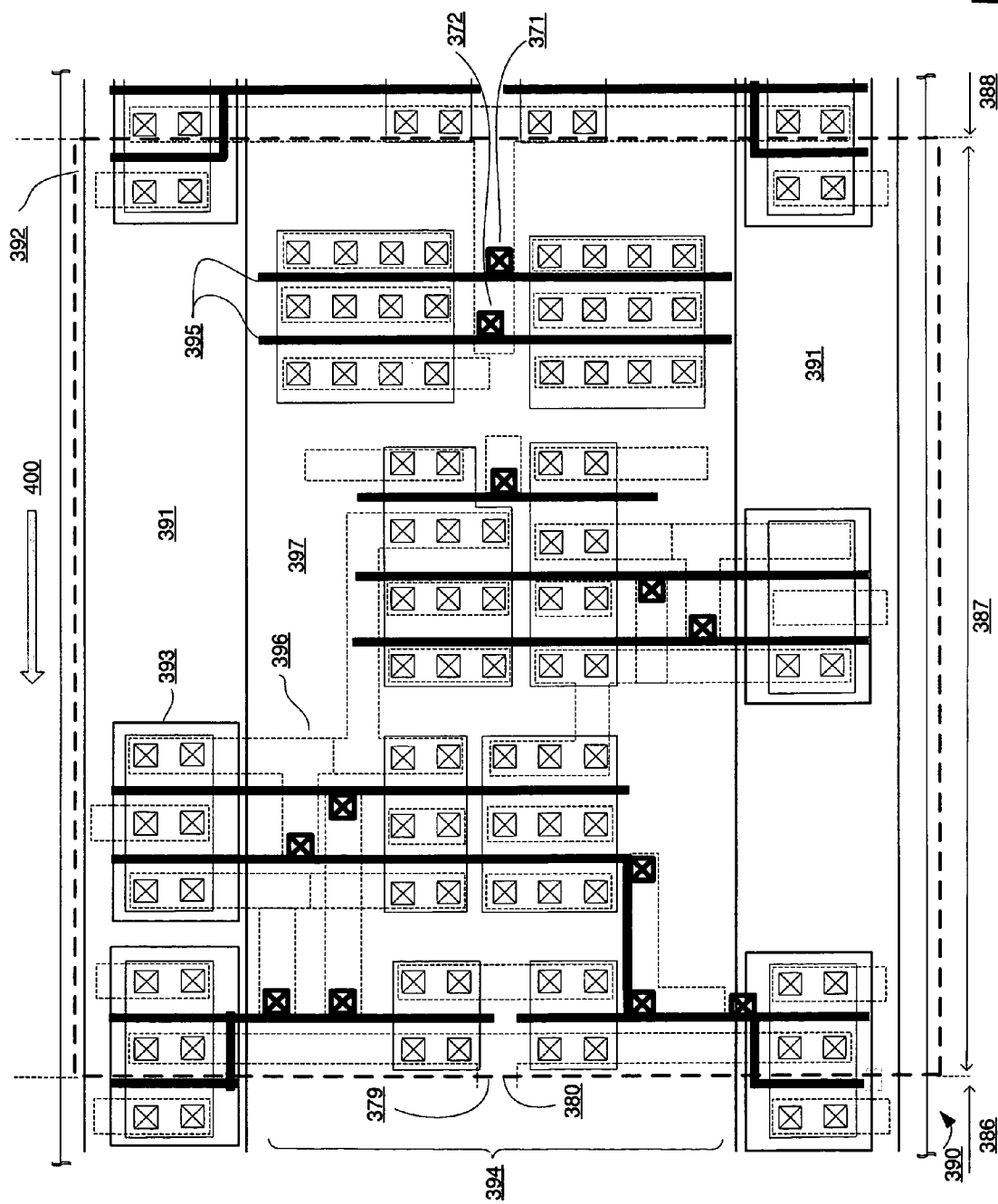
FIG. 8 is a block diagram depicting an exemplary embodiment of a layout for asynchronous counter stages.

FIG. 8 is a block diagram depicting an exemplary embodiment of a layout 390 of one tile 392 of an asynchronous counter stage 360 of FIG. 5. In or over N-wells 391, PMOS portions 393 of circuitry are formed. Between N-wells 391 is region 397 where NMOS portions 394 of the circuitry are formed. The clock direction for this embodiment is shown at 400. NMOS portions of asynchronous counter stages may be repeated within each layout section 386, 387 and 388 to a target width for an asynchronous counter. This repetition of printing a same circuit facilitates an increase in density while simplifying manufacture of an asynchronous counter to a target width.

At terminals connected to respective conductive lines 395, such as "poly" lines, are input count_B 372 and input count 371 of FIG. 5, respectively, from a preceding asynchronous counter stage. Poly lines are formed of polycrystalline silicon, "poly", doped as to be conductive. Output from this tile are output Q 379 and Q_B 380 of FIG. 5, which may be provided to a subsequent asynchronous counter stage. It will be appreciated that in the repeating layout disclosed here, output Q 379 of one tile forms input count_B 372 of the succeeding tile. Similarly, output_B of one tile forms input count 371 of the succeeding tile.

The foregoing illustrates three advantages of this embodiment. First, N-wells 391 provide a degree of electrical isolation of P-well region 397 from PMOS circuitry 393, such as cross-coupled loads 361 and 362 of FIG. 5. This isolation reduces substrate noise generation. Second, as shown, this embodiment forms a scalable, repeatable layout with straight poly lines, e.g. poly lines 395. Third, as previously discussed, the fact that the outputs of one tile form the inputs of the succeeding tile minimizes wire load on the inputs and outputs of each asynchronous counter stage.

Figure 9:
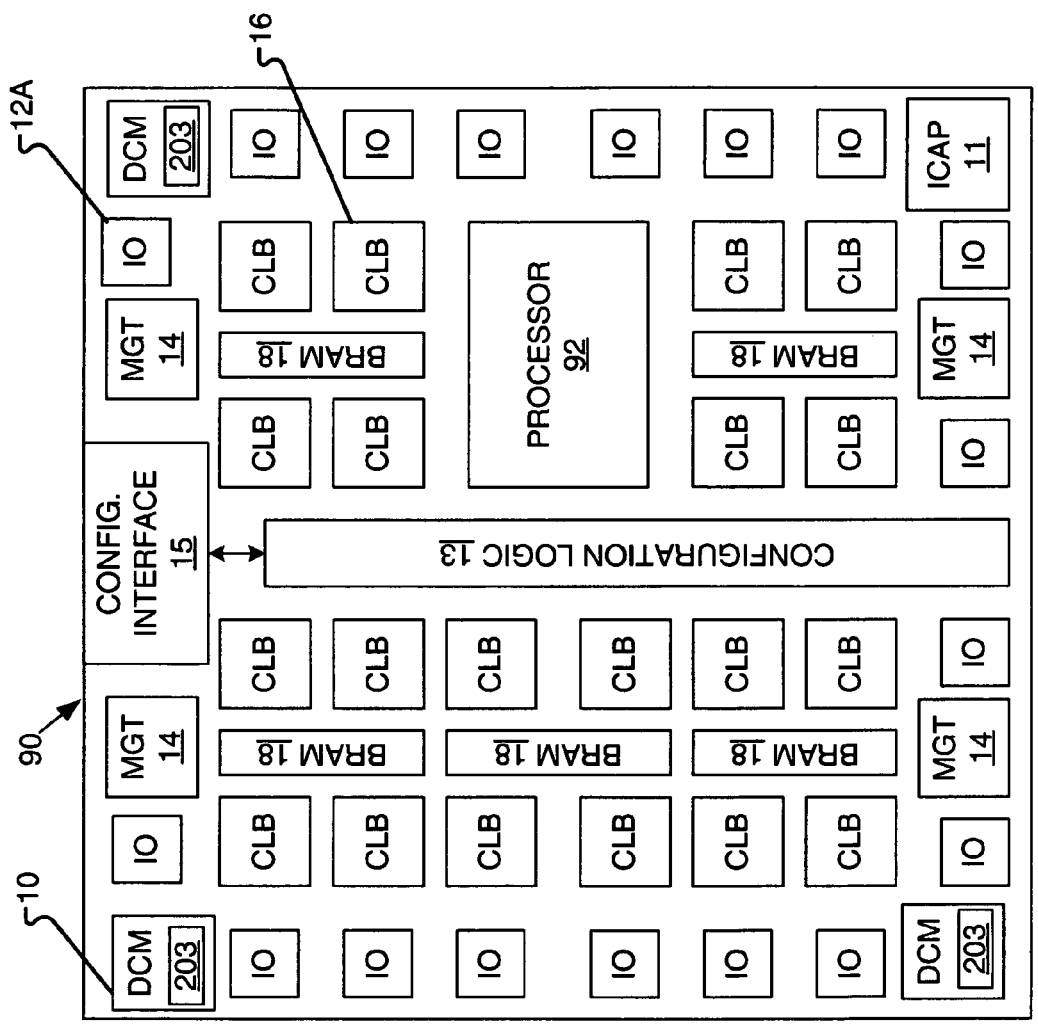
FIG. 9 is a block diagram depicting an exemplary embodiment of a field programmable gate array ("FPGA").

FIG. 9 is a block diagram depicting an exemplary embodiment of an FPGA 90. FPGA 90 includes: input/output (I/O) blocks 12 (each labeled IO) located around the perimeter of FPGA 90, multi-gigabit transceivers (MGT) 14 interspersed with the I/O blocks, configurable logic blocks 16 (each labeled CLB) arranged in an array, block random access memory 18 (each labeled BRAM) interspersed with CLBs 16, configuration logic 13, configuration interface 15, on-chip processor 92, and internal configuration access port (ICAP) 11. Processor 92 may be a dedicated ("embedded") processor or instantiated in configurable logic as a "soft processor". Notably, processor 92 may include more than one microprocessor.

Although FIG. 9 illustratively shows a relatively small number of I/O blocks, CLBs and block RAMs ("BRAMs") for purposes of illustration, it should be understood that an FPGA 90 conventionally includes many more of these elements. FPGA 90 may include other elements, such as a programmable interconnect structure and a configuration memory array, which are not illustratively shown in FIG. 9. Additional details regarding various FPGA architectures, such as the Virtex-II Pro FPGA available from Xilinx, Inc., 2100 Logic Drive, San Jose, Calif. 95124, are well-known in the art.

FPGA 90 includes digital clock managers 10. Digital clock managers 10 may include at least one hybrid counter 203, for example for stepping down frequency of a received reference clock signal. Though an FPGA 90 is illustratively shown, it should be appreciated that hybrid counter 203 may be implemented in any of a variety of known integrated circuits for counting or more particularly, for stepping down clock frequency.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. In an integrated circuit, a hybrid counter comprising:
    a first stage coupled for receiving an input clock signal, the first stage including an asynchronous counter, the asynchronous counter including at least one asynchronous counter stage having an asynchronous level-mode state machine; and
    a second stage coupled for receiving an output clock signal from the first stage, the second stage including a synchronous counter;
    wherein the first stage steps down the frequency of the input clock signal to provide the output clock signal; and
    wherein the first stage is responsive to both rising and falling edges of the input clock signal.

2. The hybrid counter, according to claim 1, wherein the first stage is configured to level-shift while responding to edges of the input clock signal.

3. The hybrid counter, according to claim 1, wherein the input clock signal frequency is stepped down by a factor of approximately eight to provide the output clock signal.

4. The hybrid counter, according to claim 3, wherein the input clock signal frequency is at least approximately 400 MHz.

5. The hybrid counter, according to claim 1, wherein the asynchronous level-mode state machine is formed of Differential Cascode Voltage Switch Logic.

6. The hybrid counter, according to claim 1, wherein the at least one asynchronous counter stage comprises:
    a first asynchronous counter stage coupled to receive an input clock signal and a complement of the input clock signal, the first asynchronous counter including a first asynchronous level-mode state machine configured to provide count signals responsive to the input clock signal and the complement of the input clock signal, the first asynchronous level-mode state machine being formed of Differential Cascode Voltage Switch Logic.

7. The hybrid counter, according to claim 6, further comprising a second asynchronous counter stage coupled to receive the count signals, the second asynchronous counter stage having a second asynchronous level-mode state machine.

8. The hybrid counter, according to claim 7, wherein the first asynchronous counter stage and the second asynchronous counter stage are configured to progressively step down frequency of the input clock signal to provide a clock output signal at a fraction of the frequency thereof.

9. The hybrid counter, according to claim 7, wherein the first asynchronous level-mode state machine and the second asynchronous level-mode state machine each have a toggle flip-flop operation.

10. The hybrid counter, according to claim 9, wherein the first asynchronous level-mode state machine and the second asynchronous level-mode state machine are each implemented with Differential Cascode Voltage Switch Logic.

11. In an integrated circuit, a hybrid counter comprising:
    a first stage coupled for receiving an input clock signal, the first stage including an asynchronous counter, the asynchronous counter including at least one asynchronous counter stage having an asynchronous level-mode state machine;
    wherein the at least one asynchronous counter stage comprises:
        a first asynchronous counter stage coupled to receive an input clock signal and a complement of the input clock signal, the first asynchronous counter including a first asynchronous level-mode state machine configured to provide count signals responsive to the input clock signal and the complement of the input clock signal, the first asynchronous level-mode state machine being formed of Differential Cascode Voltage Switch Logic;
    a second stage coupled for receiving an output clock signal from the first stage, the second stage including a synchronous counter; and
    a second asynchronous counter stage coupled to receive the count signals, the second asynchronous counter stage having a second asynchronous level-mode state machine;
    wherein the first asynchronous counter stage and the second asynchronous counter stage are configured to progressively step down frequency of the input clock signal to provide a clock output signal at a fraction of the frequency thereof; and
    wherein the second asynchronous counter stage is coupled to receive a count one signal to a complement clock port and to receive a complement of the count one signal to a non-complement clock port.

12. The hybrid counter, according to claim 11, wherein the first asynchronous counter stage is configured to provide an edge output signal and a complement of the edge output signal.

13. The hybrid counter, according to claim 12, wherein the first asynchronous level-mode state machine comprises a first portion and a second portion, the first portion and the second portion each coupled to receive the input clock signal and the complement of the input clock signal.

14. The hybrid counter, according to claim 13, wherein the first portion of the first asynchronous level-mode state machine is configured to provide the count one signal and the complement of the count one signal responsive to at least one of the input clock signal, the complement of the input clock signal, and state of the second portion of the first asynchronous level-mode state machine.

15. The hybrid counter, according to claim 14, wherein the second portion of the first asynchronous level-mode state machine is configured to provide the edge output signal and the complement of the edge output signal responsive to at least one of the input clock signal, the complement of the input clock signal, and state of the first portion of the first asynchronous level-mode state machine.

16. The hybrid counter, according to claim 15, further comprising zero count logic coupled to the first asynchronous counter stage for providing a count zero signal.

17. The hybrid counter, according to claim 16, wherein the zero count logic is configured to provide the count zero signal responsive to feedback of the count one signal, the complement of the count one signal, the edge output signal and the complement of the edge output signal.

18. The hybrid counter, according to claim 17, wherein the zero count logic is a Differential Cascode Voltage Switch Logic exclusive-OR gate coupled to receive the count one signal, the complement of the count one signal, the edge output signal and the complement of the edge output signal fed back.

19. In an integrated circuit, a hybrid counter comprising:
    a first stage coupled for receiving an input clock signal, the first stage including an asynchronous counter, the asynchronous counter including at least one asynchronous counter stage having an asynchronous level-mode state machine;
    wherein the at least one asynchronous counter stage comprises:
        a first asynchronous counter stage coupled to receive an input clock signal and a complement of the input clock signal, the first asynchronous counter including a first asynchronous level-mode state machine configured to provide count signals responsive to the input clock signal and the complement of the input clock signal, the first asynchronous level-mode state machine being formed of Differential Cascode Voltage Switch Logic;

a second stage coupled for receiving an output clock signal from the first stage, the second stage including a synchronous counter; and a second asynchronous counter stage coupled to receive the count signals, the second asynchronous counter stage having a second asynchronous level-mode state machine;

wherein the first asynchronous level-mode state machine and the second asynchronous level-mode state machine each have a toggle flip-flop operation;

wherein the first asynchronous level-mode state machine and the second asynchronous level-mode state machine are each implemented with Differential Cascode Voltage Switch Logic; and wherein the first asynchronous counter stage and the second asynchronous counter stage are laid out with a repetitive tile pattern.

20. The hybrid counter, according to claim 19, wherein each tile of the repetitive tile pattern includes at least one well region laid out so as to reduce substrate noise generation.

* * * * *